(12) United States Patent
Bhattacharyya et al.

(10) Patent No.: US 6,740,947 B1
(45) Date of Patent: May 25, 2004

(54) MRAM WITH ASYMMETRIC CLADDED CONDUCTOR

(75) Inventors: Manoj K. Bhattacharyya, Cupertino, CA (US); Thomas C. Anthony, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/293,350

(22) Filed: Nov. 13, 2002

(51) Int. Cl.$^7$ ............................................... H01L 23/48
(52) U.S. Cl. ..................... 257/421; 257/422; 257/428; 257/775; 365/171; 365/173
(58) Field of Search ................. 257/295, 390, 257/659, 692, 421, 422, 428, 775; 365/171, 173

(56) References Cited

U.S. PATENT DOCUMENTS

| | | | | |
|---|---|---|---|---|
| 3,585,616 A | * | 6/1971 | Mazzeo ..................... 365/171 |
| 5,940,319 A | * | 8/1999 | Durlam et al. ............. 365/171 |
| 5,956,267 A | | 9/1999 | Hurst et al. | |
| 6,153,443 A | * | 11/2000 | Durlam et al. ................ 438/3 |
| 6,236,590 B1 | | 5/2001 | Bhattacharyya et al. | |
| 6,351,409 B1 | | 2/2002 | Rizzo et al. | |
| 6,404,674 B1 | | 6/2002 | Anthony et al. | |
| 6,417,561 B1 | * | 7/2002 | Tuttle ........................ 257/659 |
| 6,430,084 B1 | | 8/2002 | Rizzo et al. | |
| 6,430,085 B1 | * | 8/2002 | Rizzo ......................... 365/173 |
| 6,555,858 B1 | * | 4/2003 | Jones et al. ................. 257/295 |
| 6,597,049 B1 | * | 7/2003 | Bhattacharyya et al. .... 257/421 |
| 6,661,688 B2 | * | 12/2003 | Bloomquist et al. ........ 365/171 |

* cited by examiner

Primary Examiner—David Nelms
Assistant Examiner—Dao H. Nguyen
(74) Attorney, Agent, or Firm—Trueman H Denny, III

(57) ABSTRACT

An asymmetric cladded conductor structure for a magnetic field sensitive memory cell is disclosed. One or both of the conductors that cross the memory cell can include an asymmetric cladding that covers a top surface and only a portion of the opposed side surfaces of the conductors such that the cladding on the opposed side surfaces is recessed along those opposed side surfaces in a direction away from a data layer of the memory cell. The cladding is recessed by an offset distance. The asymmetric cladding increases a reluctance of a closed magnetic path with a resulting decrease in magnetic coupling with the data layer. An aspect ratio of the memory cell can be reduced thereby increasing areal density.

24 Claims, 13 Drawing Sheets

Binary "1"    Binary "0"

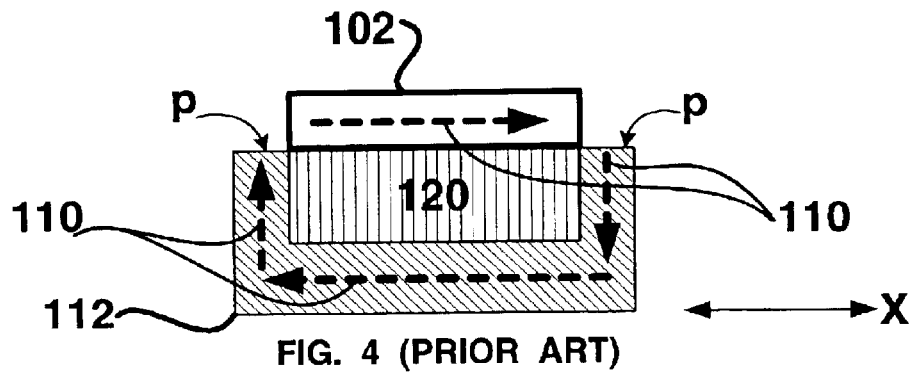
FIG. 4 (PRIOR ART)
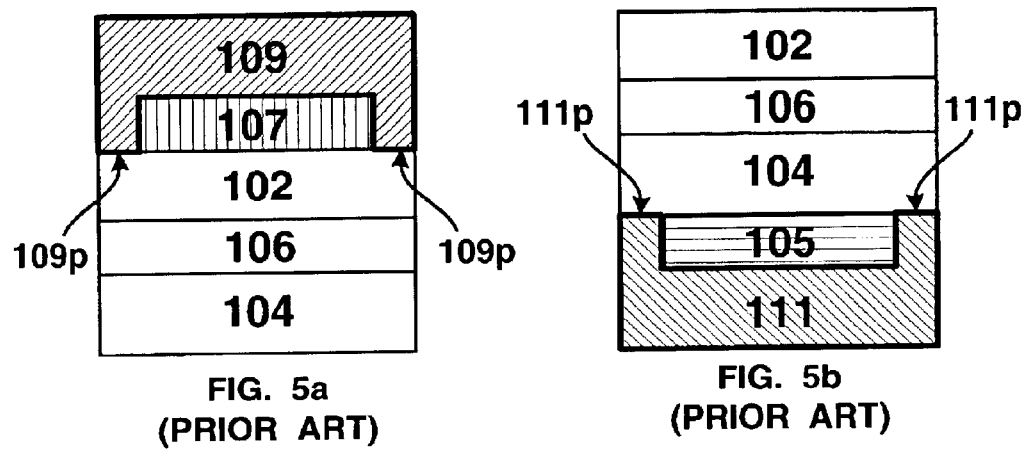
FIG. 5a (PRIOR ART)
FIG. 5b (PRIOR ART)
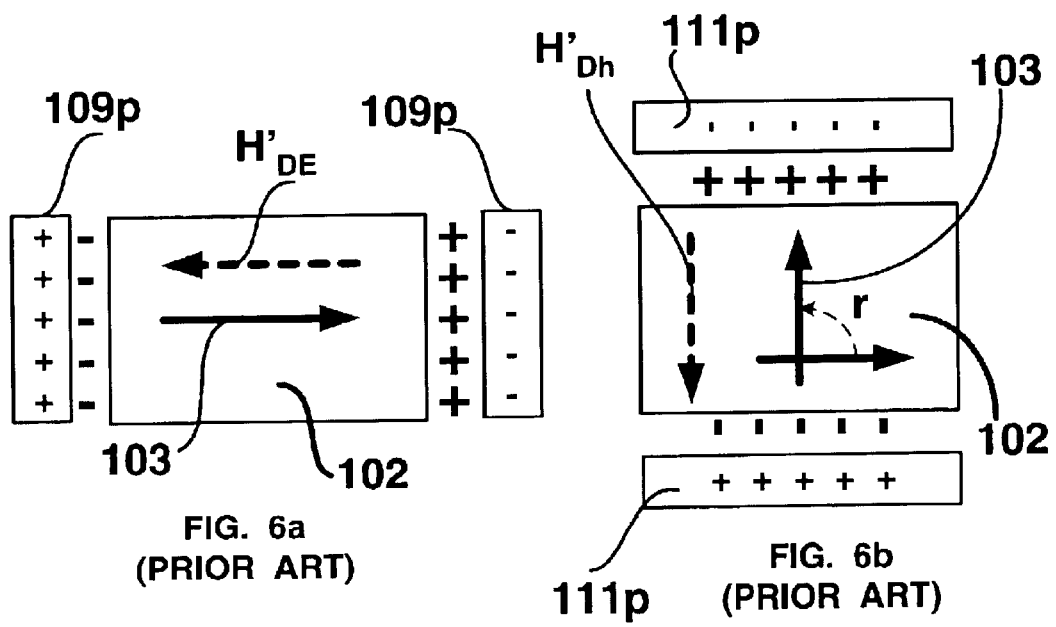
FIG. 6a (PRIOR ART)
FIG. 6b (PRIOR ART)

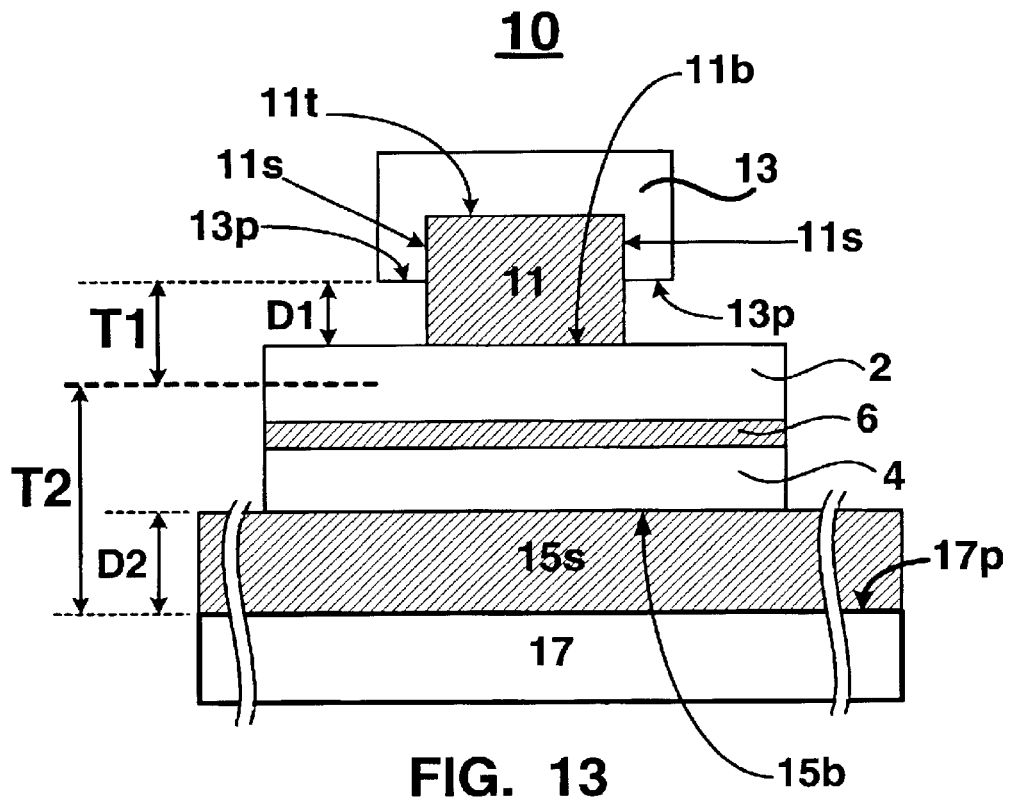

MRAM WITH ASYMMETRIC CLADDED CONDUCTOR

FIELD OF THE INVENTION

The present invention relates generally to a magnetic memory device in which at least one of the conductors includes an asymmetric cladding. More specifically, the present invention relates to a magnetic memory device in which at least one of the conductors includes an asymmetric cladding that is recessed to minimize undesirable effects to a switching characteristics of a data layer of a magnetic memory cell while providing for switching field enhancement.

BACKGROUND OF THE ART

Magnetic Random Access Memory (MRAM) is an emerging technology that can provide an alternative to traditional data storage or memory technologies. MRAM has desirable properties such as fast access times like DRAM and non-volatile data retention like hard disc drives. MRAM stores a bit of data (i.e. information) as an alterable orientation of magnetization in a patterned thin film magnetic element that is referred to as a data layer, a storage layer, a free layer, or a data film. The data layer is designed so that it has two stable and distinct magnetic states that define a binary one ("1") and a binary zero ("0"). Although the bit of data is stored in the data layer, many layers of carefully controlled magnetic and dielectric thin film materials are required to form a complete magnetic memory element. One prominent form of magnetic memory element is a spin tunneling device. The physics of spin tunneling is complex and good literature exists on this subject.

In FIG. 1a, a prior MRAM memory element 101 includes a data layer 102 and a reference layer 104 that are separated by a thin barrier layer 106. Typically the barrier layer 106 has a thickness that is less than about 2.0 nm. The memory element 101 has a width W and a length L and a ratio of the width W to the length L defines an aspect ratio (i.e. aspect ratio=W÷L). In a tunneling magnetoresistance memory (TMR) the barrier layer 106 is an electrically non-conductive dielectric material such as aluminum oxide ($Al_2O_3$), for example. Whereas, in a giant magnetoresistance memory (GMR) the barrier layer 106 is a thin layer of conductive material such as copper (Cu), for example. The reference layer 104 has a pinned orientation of magnetization 108, that is, the pinned orientation of magnetization 108 is fixed in a predetermined direction and does not rotate in response to an external magnetic field. In contrast the data layer 102 has an alterable orientation of magnetization 103 that can rotate between two orientations in response to an external magnetic field. The alterable orientation of magnetization 103 is typically aligned with an easy axis E of the data layer 102.

In FIG. 1b, when the pinned orientation of magnetization 108 and the alterable orientation of magnetization 103 point in the same direction (i.e. they are parallel to each other) the data layer 102 stores a binary one ("1"). On the other hand, when the pinned orientation of magnetization 108 and the alterable orientation of magnetizations 103 point in opposite directions (i.e. they are anti-parallel to each other) the data layer 102 stores a binary zero ("0").

In FIG. 2a, the prior memory element 101 is typically positioned at an intersection of two orthogonal conductors 105 and 107. For instance, the conductor 105 can be a word line and the conductor 107 can be a bit line. Collectively, the conductors (105, 107) can be called write lines. A bit of data is written to the memory element 101 by generating two magnetic fields $H_x$ and $H_y$ that are in turn generated by currents $I_y$ and $I_x$ flowing in the conductors 107 and 105 respectively. The magnetic fields $H_x$ and $H_y$ cooperatively interact with the data layer 102 to rotate the alterable orientation of magnetization 103 from its current orientation to a new orientation. Therefore, if the current orientation is parallel (i.e. a positive X-direction on a x-axis X) with the pinned orientation of magnetization 108 such that a binary "1" is stored in the data layer 102, then the magnetic fields $H_x$ and $H_y$ will rotate the alterable orientation of magnetization 103 to an anti-parallel orientation (i.e. a negative X-direction on the x-axis X) such that a binary "0" is stored in the data layer 102.

In FIG. 2a, the alterable orientation of magnetization 103 is illustrated in the process of rotating from the positive X-direction to the negative X-direction. Both of those directions are aligned with the easy axis E. However, during the rotation, the alterable orientation of magnetization 103 will be temporarily aligned with a hard axis H that is aligned with a positive Y-direction and a negative Y-direction of a y-axis Y.

In FIG. 2b, the prior memory element 101 is positioned in an array 201 of similar memory elements 101 that are also positioned at an intersection of a plurality of the conductors 107 and 105 that are arranged in rows and columns. For purposes of illustration, in FIG. 2b, the conductors 107 are bit lines and the conductors 105 are word lines. A bit of data is written to a selected one of the memory elements 101 that is positioned at an intersection of a word and bit line by passing the currents $I_y$ and $I_x$ through the word and bit lines. During a normal write operation, the selected memory element 101 will be written to only if the combined magnetic fields $H_x$ and $H_y$ are of a sufficient magnitude to switch (i.e. rotate) the alterable orientation of magnetization of the memory element 101.

In FIG. 3a, when the alterable orientation of magnetization 103 is aligned with the easy axis E, the prior data layer 102 will have magnetic charges, denoted as a plus sign+and a minus sign–, and those magnetic charges (+, –) generate a demagnetization field $H_{DE}$. The demagnetization field $H_{DE}$ facilitates switching of the data layer 102 by reducing a magnitude of the combined magnetic fields ($H_x$, $H_y$) that are required to rotate the alterable orientation of magnetization 103. Essentially, the amount of energy required to rotate the alterable orientation of magnetization 103 is reduced.

Similarly, in FIG. 3b, when the alterable orientation of magnetization 103 is in a partially rotated position that is parallel to the hard axis H, another demagnetization field $H_{Dh}$ is generated by magnetic charges (+, –). Those magnetic charges oppose further rotation of the alterable orientation of magnetization 103.

The switching characteristics of the data layer 102 are determined in part by the magnitudes of the demagnetization fields ($H_{DE}$, $H_{Dh}$). Preferably, the magnitude of the demagnetization field $H_{DE}$ is sufficient to reduce the amount of energy required to initiate rotation of the alterable orientation of magnetization 103 and the magnitude of the demagnetization field $H_{Dh}$ is sufficient to slightly resist further rotation of the alterable orientation of magnetization 103 so that as the alterable orientation of magnetization 103 passes through the hard axis H, the data layer 102 does not immediately switch (i.e from a logic "1" to a logic "0").

One of the disadvantages of prior MRAM designs is that the currents ($I_y$, $I_x$) that are required to generate the combined magnetic fields ($H_x$, $H_y$) are too high. High current is undesirable for several reasons. First, high currents increase power consumption which is undesirable in portable electronics or battery powered electronics. Second, high currents can result in increase waste heat generation which can require fans or other cooling devices to efficiently dissipate the waste heat. Those cooling devices add to the cost, weight, and power drain in battery operated devices. Third, larger drive circuits are required to source those high currents and the larger drive circuits reduce an amount of die area available for memory or other critical circuits in a memory device. Finally, the conductors that carry the current can fail due to electromigration caused by a high current density in the conductors.

Prior methods for reducing the currents ($I_y$, $I_x$) include cladding the conductors (105, 107) with a soft magnetic material as illustrated in FIG. 4. A cladding 112 that covers an entirety of three sides of a conductor 120 and includes poles p that are positioned flush with a surface of the conductor 120 and adjacent to the data layer 102. The cladding 112 enhances the available magnetic field and creates a closed magnetic path 110 in a direction along the x-axis X. The closed magnetic path provides flux closure of the magnetic fields ($H_x$, $H_y$) and efficiently couples those fields with the data layer 102.

Additionally, the closed magnetic path 110 increases an effective length of the data layer 102 thereby increasing a shape anisotropy of the data layer 102. A larger shape anisotropy increases the magnetic stability of the data layer 102. Typically, to achieve the desired magnetic stability via shape anisotropy, the data layer 102 is made longer in the direction of the easy axis E such that the memory cell 101 is longer in the width W dimension than it is in the length L dimension. Although the increase in effective length further increases the magnetic stability of the data layer 102 it also has the disadvantage of making it harder to switch the data layer 102. As a result, more current is required to effectuate switching the data layer 102. Because the data layer 102 has already been made physically longer in the direction of the easy axis E, that physical length is made even longer by the addition of the effective length created by the closed magnetic path 110. Consequently, the use of the cladding 112 exacerbates the switching current requirements even though the cladding 112 has the effect of focusing the available magnetic field at the data layer 102.

Moreover, the desired increase in shape anisotropy comes at the expense of increased memory cell size because increasing the physical length of the data layer 102 also increases the area occupied by the memory cell 101. As a result, aspect ratios in a range of about 2.0 to about 3.0 or more are common. Consequently, areal density is reduced because the memory cell 101 occupies a larger area. Ideally, the aspect ratio should be as close to to 1.0 as possible so that areal density can be increased.

In FIG. 5c an array 203 includes the prior memory elements 101 positioned at an intersection between a pair of cladded conductors (105c, 107c). In FIG. 5a, a cross-sectional view along the X-axis X of FIG. 5c, illustrates the conductor 107c having a cladding 109 that covers an entirety of three sides of the conductor 107c and includes poles 109p that are positioned flush with a surface of the conductor 107c and are positioned adjacent to the data layer 102.

In FIG. 6a, one disadvantage of the structure of FIG. 5a is that the poles 109p generate magnetic charges (+, −) of opposite polarity to those generated by the data layer 102. The magnetic charges (+, −) generated by the poles 109p significantly reduce or cancel the demagnetization field $H'_{DE}$ so that more energy (i.e. a stronger magnetic field $H_x$) is required to rotate the alterable orientation of magnetization 103. As a result, more current $I_y$ must be supplied to generate a higher magnitude of the magnetic field $H_x$. Therefore, the cladding 109 has a detrimental effect on one component of the switching characteristic of the data layer 102. Moreover, the cladding 109 increases the effective length of the data layer 102 as was described above. Consequently, the current $I_y$ must be further increased to effectuate switching the data layer 102. The closed magnetic path generated by the cladding 109 creates a low reluctance path through the data layer 102 resulting in a strong coupling of the magnetic field with the data layer 102 and the effects of the aforementioned demagnetization field $H'_{DE}$ and the increase in the effective length of the data layer 102 are exacerbated by that strong coupling.

In FIG. 5b, a cross-sectional view along the Y-axis Y of FIG. 5c, illustrates the conductor 105c having a cladding 111 that covers an entirety of three sides of the conductor 105c and includes poles 111p that are positioned flush with a surface of the conductor 105c and are positioned adjacent to the data layer 102.

In FIG. 6b, one disadvantage of the structure of FIG. 5b is that the poles 111p generate magnetic charges (+, −) of opposite polarity to those generated by the data layer 102. Those magnetic charges reduce a coercivity of the data layer 102 with a resulting reduction or cancellation of the demagnetization field $H'_{Dh}$. As a result, there is little or no resistance to rotation of the alterable orientation of magnetization 103 as it passes through the through the hard axis H. Therefore, the cladding 111 has a detrimental effect on another component of the switching characteristic of the data layer 102. The effects of the demagnetization field $H'_{Dh}$ are also exacerbated by a strong coupling of the magnetic field with the data layer 102 due to the cladding 111.

Consequently, there exists a need for a cladding structure for one or more conductors of a magnetic memory cell that provides for switching field enhancement without the detrimental effects to a switching characteristics of a data layer of the magnetic memory cell. There is a need for a cladding structure that increases the reluctance of a magnetic path so that magnetic coupling is reduced. There is also a need for a cladding structure that allows for a reduction in an aspect ratio of the magnetic memory cell so that areal density is increased.

SUMMARY OF THE INVENTION

The present invention address the aforementioned problems created by the prior cladded conductors by asymmetrically cladding one or more of the conductors that cross a magnetic memory cell. A magnetic memory device includes a magnetic field sensitive memory cell and a first conductor that crosses the memory cell in a length direction and a second conductor that crosses the memory cell in a width direction. The first conductor includes a first cladding that covers a top surface and a portion of two side surfaces thereof. The cladding includes a first pair of poles that are positioned adjacent to the two side surfaces and are recessed along the two side surfaces by a first offset distance.

In one embodiment, the second conductor also includes a second cladding that covers the top surface and a portion of the two side surfaces thereof. The second cladding includes a second pair of poles that are positioned adjacent to the two side surfaces and are recessed along the two side surfaces by a second offset distance. The first and second offset distances need not be equal to each other so that the first and second poles are not equidistantly spaced apart from each other relative to a data layer of the memory cell or some other reference point on the memory cell.

Either one or both of the first and second conductors can be laterally displaced relative to their respective crossing directions such that the conductor is not symmetrically centered with the memory cell. The lateral displacement can be used to change a point within the data layer in which nucleation of switching occurs with a resulting change in a switching characteristic of the memory cell.

The aforementioned problems caused by a strong magnetic coupling between the magnetic field generated by the cladded conductor and the data layer are reduced by the recessed poles because the reluctance of the magnetic path is increased. The increased effective length of the data layer along the easy axis is also reduced by the recessed poles because the increased reluctance operates to reduce coupling of the magnetic field with the data layer.

The recessed poles reduce the cancellation effect of the magnetic charges generated by the poles such that demagnetization fields along an easy axis and a hard axis of the data layer are reduced or eliminated and a desirable switching characteristic of the data layer is obtained while also enhancing a switching field generated by current flowing in the first and second conductors.

By asymmetrically cladding one or both of the first and second conductors, an aspect ratio of the memory cell can be reduced over prior memory cells with cladded conductors.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIG. 1b is a schematic depicting data storage in the prior magnetic memory element of FIG. 1a.

FIG. 4 is a cross-sectional view depicting a prior cladded conductor.

FIGS. 5a and 5b are cross-sectional views depicting a prior memory element having a pair of cladded conductors.

FIGS. 6a and 6b depict detrimental effects to a switching characteristic of a prior memory element caused by the prior cladded conductors of FIGS. 5a and 5b respectively.

FIG. 13 is a schematic depicting an asymmetrical spacing between the first and second pair of poles and a data layer according to the present invention.

FIG. 16 is a schematic view depicting a demagnetization field created by a current flowing in a second conductor including a second asymmetric cladding according to the present invention.

DETAILED DESCRIPTION

Figure 1A:
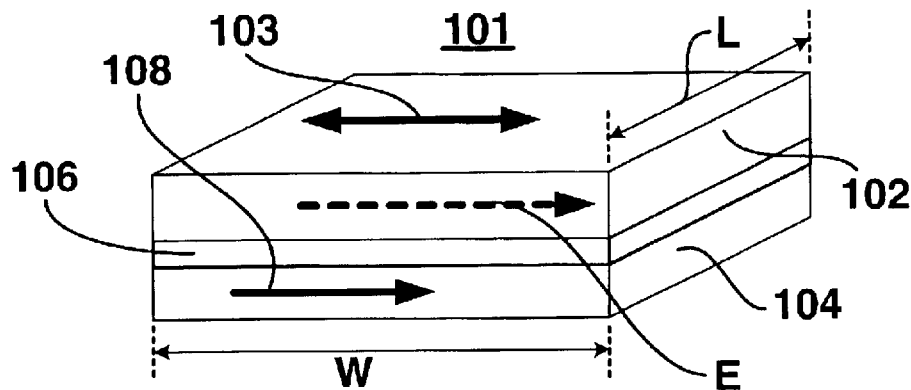
FIG. 1a is a profile view of a prior magnetic memory element.
Figure 1B:
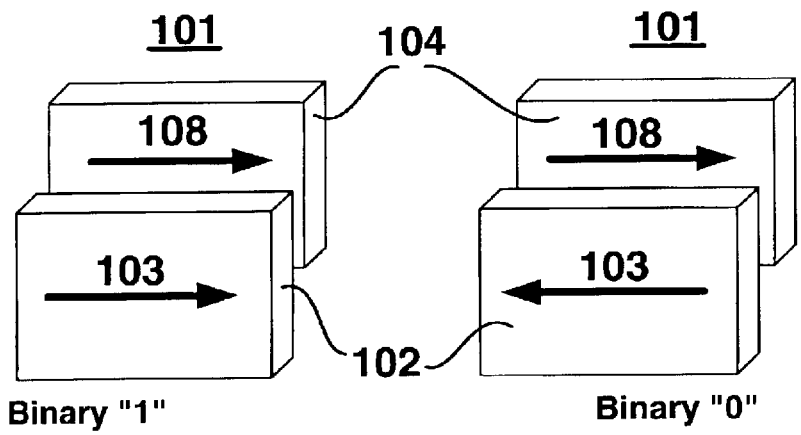
Figure 2A:
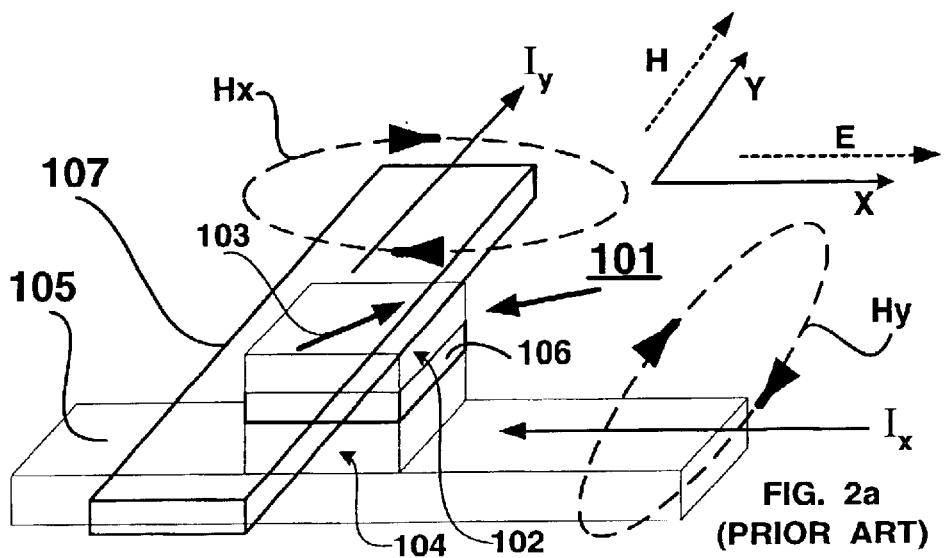
FIG. 2a is a schematic depicting a prior memory element that is crossed by two conductors.
Figure 2B:
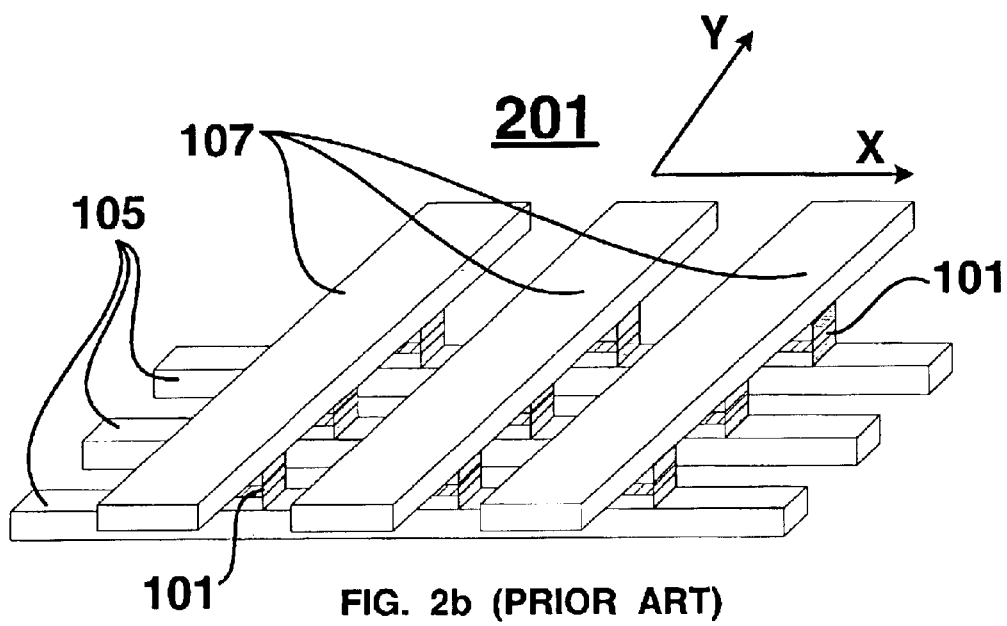
FIG. 2b is a schematic depicting a prior MRAM array.
Figures 3A, 3B:
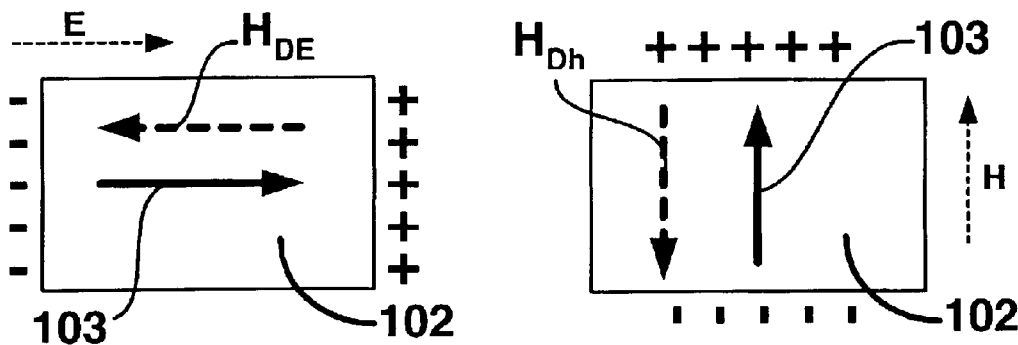
FIGS. 3a and 3b are top plan views depicting demagnetization fields along an easy axis and a hard axis respectively of a prior memory element.
Figure 5C:
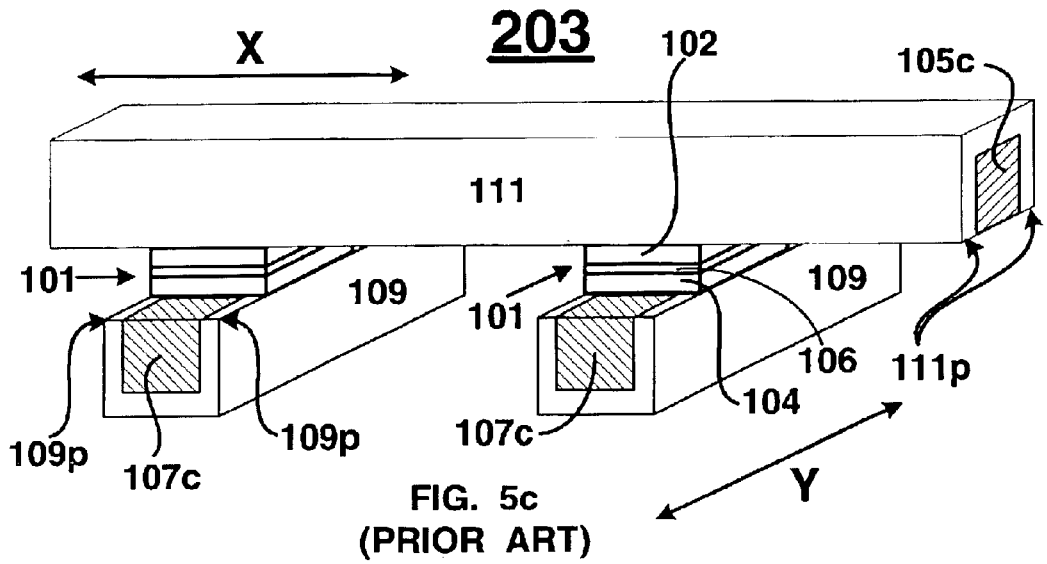
FIG. 5c is a schematic depicting a prior MRAM array having prior memory cells that are crossed by cladded conductors.

In the following detailed description and in the several figures of the drawings, like elements are identified with like reference numerals.

As shown in the drawings for purpose of illustration, the present invention is embodied in an asymmetric cladding structure for a magnetic memory device including a magnetic field sensitive memory cell (memory cell hereinafter).

In FIGS. 7a through 8b, a magnetic memory cell 10 comprises a plurality of layers including but not limited to a reference layer 4, a data layer 2, and a barrier layer 6 positioned intermediate between the data and reference layers (2, 4). As is well understood in the MRAM art, the data layer 2 includes an alterable orientation of magnetization as denoted by the double arrow M and the reference layer 4 includes a pinned orientation of magnetization P that does not rotate its orientation in response to external magnetic fields. Typically, the pinned orientation of magnetization P is determined and permanently set as part of the manufacturing process of the memory cell 10. The alterable orientation of magnetization M can have an orientation that can be parallel or anti-parallel with the pinned orientation of magnetization P and that orientation can be changed by externally supplied magnetic fields of sufficient magnitude.

It is also well understood in the MRAM art that the barrier layer 6 is a thin layer of an electrically non-conductive material (i.e. a dielectric material) such as aluminum oxide ($Al_2O_3$), aluminum nitride ($AlN_x$), magnesium oxide (MgO), or tantalum oxide ($TaO_x$) for a TMR device. Conversely, for a GMR device the barrier layer 6 is an electrically conductive non-magnetic material such as cooper (Cu), gold (Au), or silver (Ag). Although a magnetic field sensitive memory device can include several layers of thin film materials, for purposes of simplicity of illustration, the magnetic memory cell 10 is shown as including the reference layer 4, the data layer 2, and the barrier layer 6, but is not to be construed as being limited to those layers only.

Figure 7B:
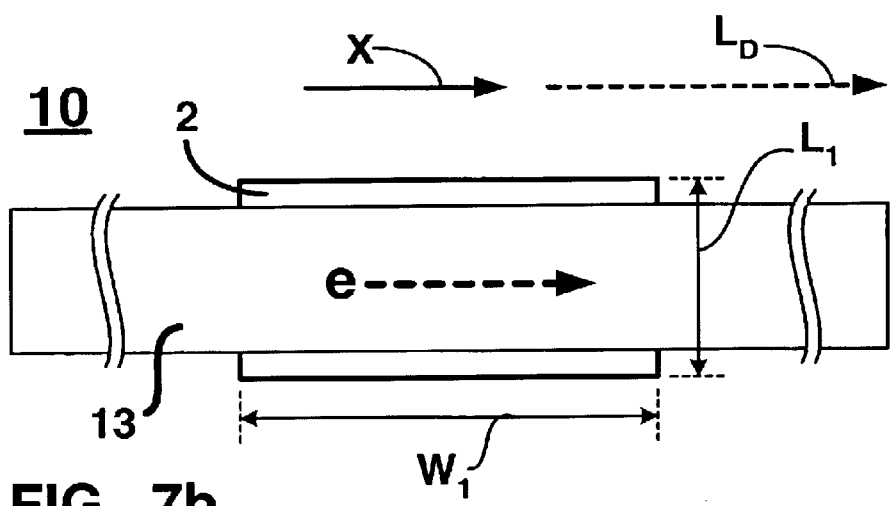
FIG. 7b is a top plan view of a first asymmetric cladding of a first conductor that crosses a magnetic field sensitive memory cell according to the present invention.
Figure 8A:
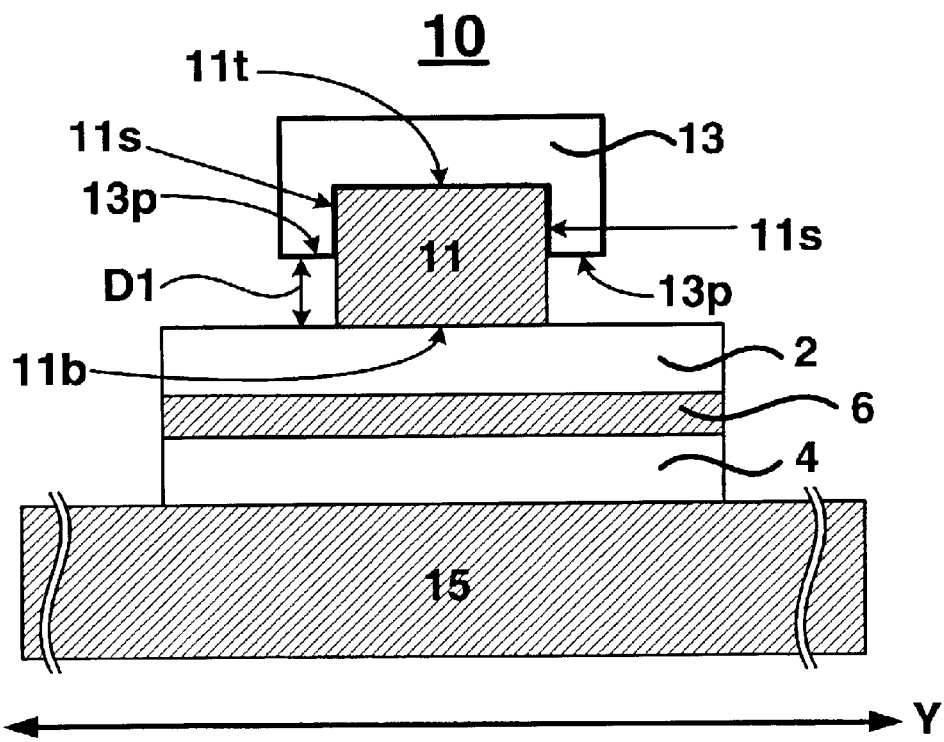
FIGS. 8a and 8b are cross-sectional views of a first conductor and a second conductor that cross the memory cell and the first conductor including a first asymmetric cladding according to the present invention.

A first conductor 11 crosses the memory cell 10 in a length direction $L_D$ of the memory cell 10 and the first conductor 11 includes a top surface 11t, two side surfaces 11s, and a bottom surface 11b (see FIG. 8a). In FIG. 7b, the first conductor 11 is covered by a first asymmetric cladding 13 as will be described below. The bottom surface 11b is positioned in facing relation with the memory cell (i.e. the bottom surface 11b faces the data layer 2). The bottom surface 11b need not be in direct contact with the data layer 2 and one or more layers of thin film materials of a MRAM stack may be positioned between the bottom surface 11b and the data layer 2.

In FIG. 8a, a first asymmetric cladding 13 is connected with the top surface 11t and a portion of the two side surfaces 11s of the first conductor 11. That is, the first asymmetric cladding 13 does not cover an entirety of the two side surfaces 11s. The first asymmetric cladding 13 includes a first pair of poles 13p that are recessed along the two side surfaces 11s (i.e. in a direction that is away from the data layer 2) and are offset from the memory cell 10 by a first distance D1. The asymmetry in the first asymmetric cladding 13 is due to the cladding covering only a portion of the opposed side surfaces 11s such that the first pair of poles 13p are not flush with the bottom surface 11b.

Figure 8B:
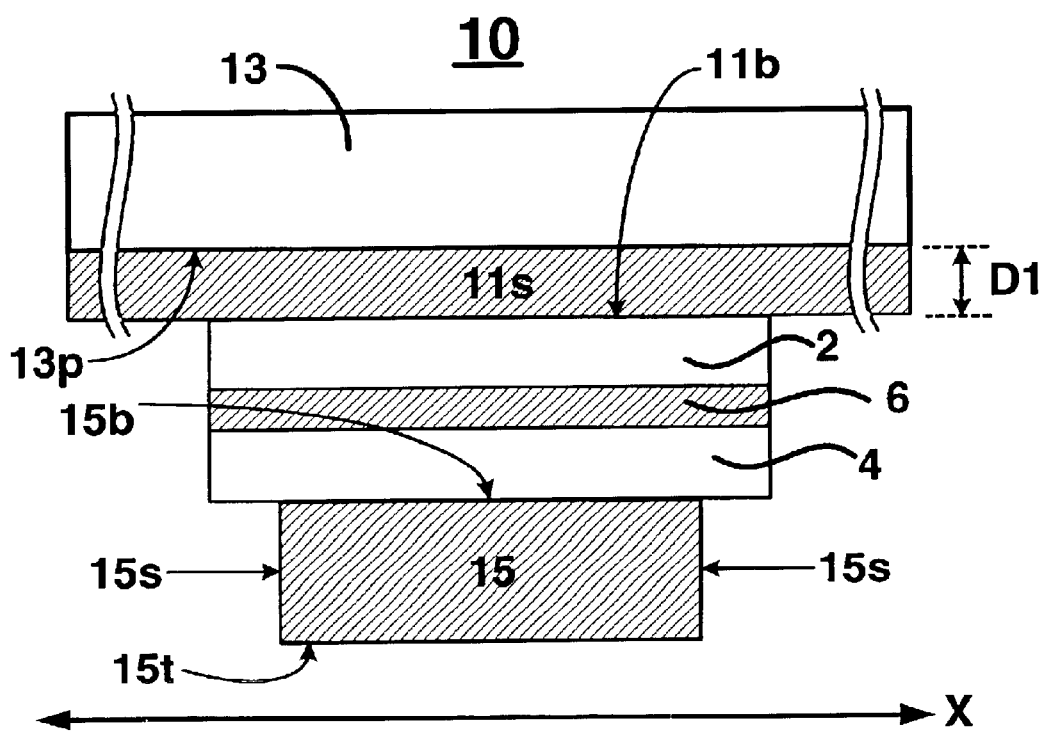

In FIG. 8b, a second conductor 15 crosses the memory cell 10 in a width direction $W_D$ and includes a top surface 15t, two side surfaces 15s and a bottom surface 15b that is also positioned in facing relation with the memory cell 10 (i.e. the bottom surface 15b faces the data layer 2). As was stated above for the bottom surface 11b, the bottom surface 15b of the second conductor 15 need not be in direct contact with the data layer 2. The above mentioned external magnetic fields are generated by currents (not shown) that flow through the first and second conductors (11, 15) and those external magnetic fields combine with each other to interact with the data layer 2 to rotate the alterable orientation of magnetization M during a write operation to the memory cell 10.

Figure 18:
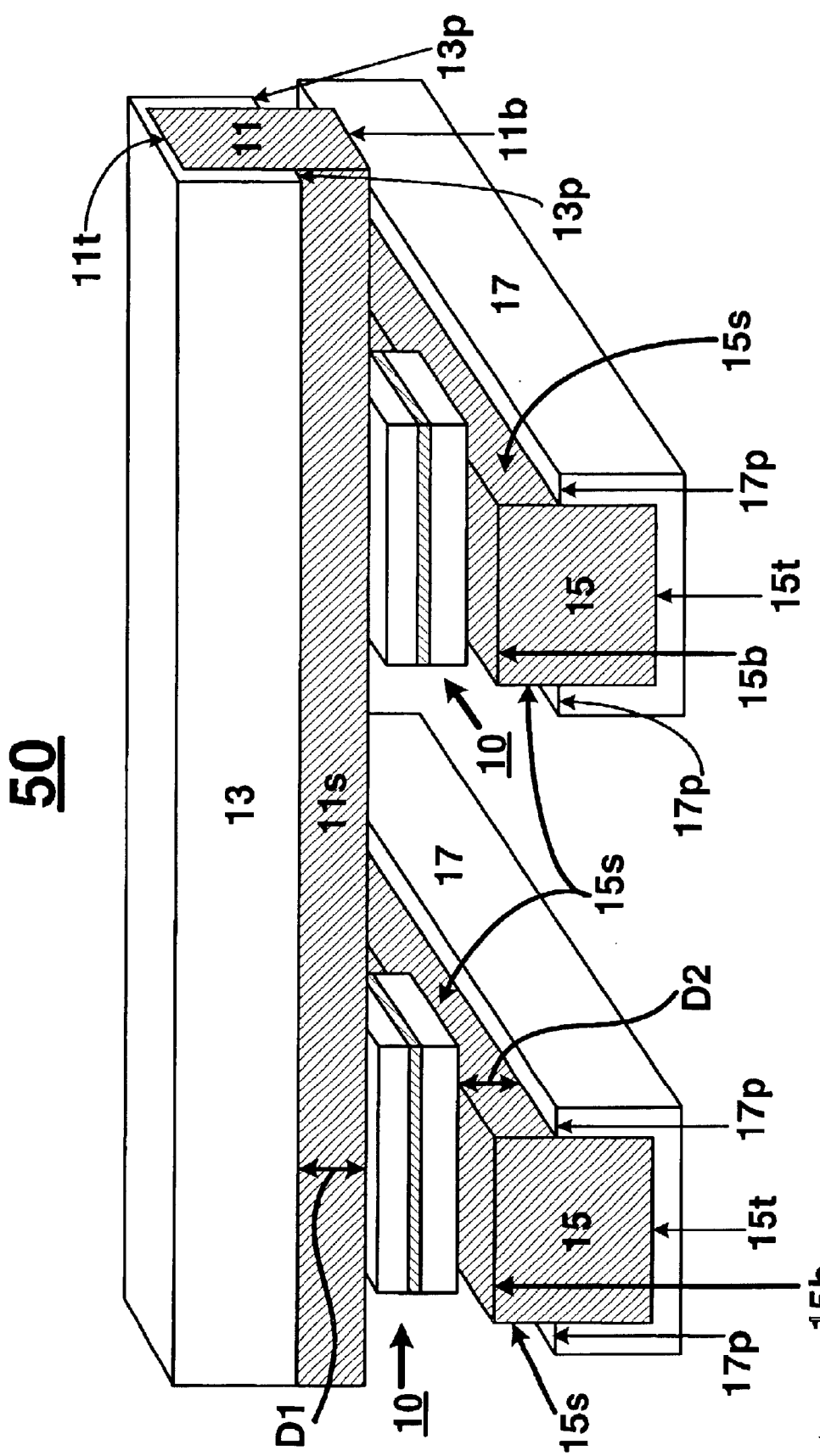
FIG. 18 is a profile view of an array of magnetic memory devices with asymmetric cladded conductors according to the present invention.

Collectively, the first and second conductors (11, 15) can be referred to as write lines. Depending on the architecture of the memory device, the first conductor 11 can be a word line and the second conductor 15 can be a bit line, or vice-versa. For instance, the word and bit lines can be arranged in an array in which the bit lines traverse rows of the array and the word lines traverse columns of the array or in which the bit lines traverse columns of the array and the word lines traverse rows of the array. In FIG. 18, an MRAM array 50 includes a plurality of the memory cells 10 and includes an asymmetrically cladded conductor 11 in a row of the array 50 and asymmetrically cladded conductors 15 (as will be described below) in columns of the array 50. The memory cells 10 are positioned at an intersection of a row conductor and a column conductor.

Figure 15:
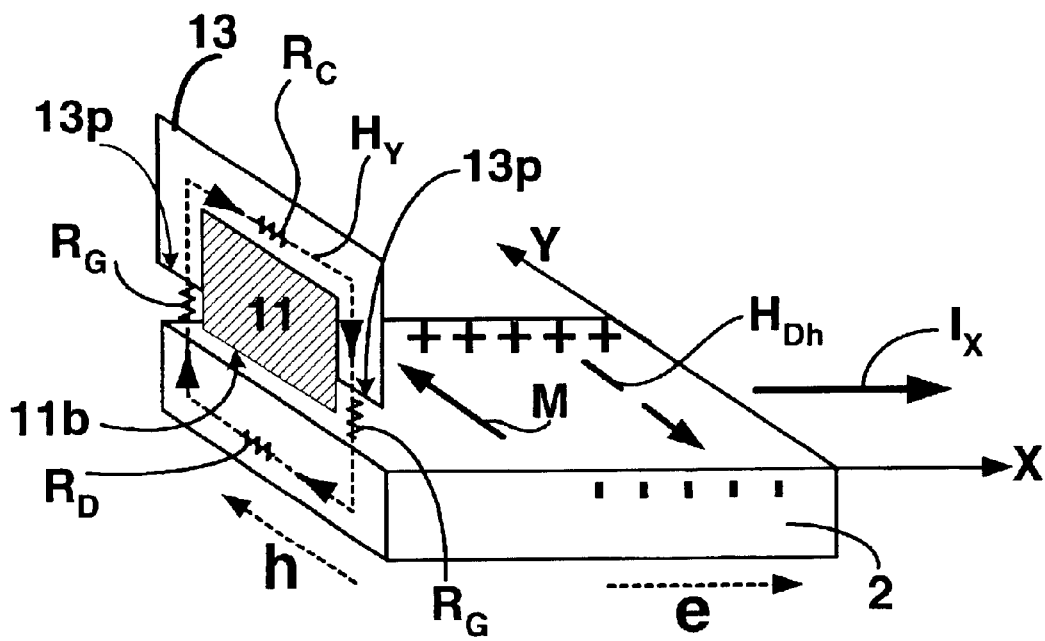
FIG. 15 is a schematic view depicting a demagnetization field created by a current flowing in a first conductor including a first asymmetric cladding according to the present invention.

In FIG. 15, a current $I_x$ flowing in the first conductor 11 generates a magnetic field $H_y$ that magnetically interacts with the data layer 2 through a closed magnetic path created by the first asymmetric cladding 13 (see dashed lines for $H_y$ that depict flux closure with the data layer 2). Because the first pair of poles 13p are recessed by the first distance D1, a reluctance $R_G$ of the closed magnetic path is higher at the first pair of poles 13p than a reluctance $R_c$ in the first asymmetric cladding 13 and a reluctance $R_D$ in the data layer 2. Essentially, the first distance D1 interposes a gap that increases the total reluctance of the closed magnetic path for $H_y$. As a result, magnetic coupling of the magnetic field $H_y$ with the data layer 2 is reduced with a resulting reduction in a magnitude of a demagnetization field $H_{Dh}$ that is aligned with the hard axis h and is generated by magnetic charges (+,−) in the data layer 2 caused by the proximity of the first pair of poles 13p with the data layer 2.

One benefit of reducing the strength of the demagnetization field $H_{Dh}$ is that a tendency of the alterable orientation of magnetization M to resist further rotation when aligned with the hard axis h is reduced. The recessed first pair of poles 13p position the magnetic material of the first asymmetric cladding 13 away from the data layer 2 so that there is less magnetic interference between the first asymmetric cladding 13 and the data layer 2.

In prior memory cells with cladded conductors, the cladding enhances the magnetic field at the data layer with a resulting decrease in the coercivity of the data layer and an increase in the demagnetization field $H'_{Dh}$. The demagnetization field $H'_{Dh}$ creates a stable low energy state for the alterable orientation of magnetization M. Consequently, the alterable orientation of magnetization M resists being rotated out of that stable state. Therefore, only a magnetic field of sufficient magnitude can urge the alterable orientation of magnetization M of the prior memory cells to rotate out of that stable state. Unfortunately, a larger current is required to generate that magnetic field and as was describe above, large currents are undesirable.

Therefore, by reducing the magnetic coupling and the magnitude of the demagnetization field $H_{Dh}$, the first asymmetric cladding 13 of the present invention provides a controlled energy state for the alterable orientation of magnetization M which allows for an improved switching characteristic of the data layer 2 and a reduction in a magnitude of the current $I_x$ required to rotate the alterable orientation of magnetization M through the hard axis h.

Figure 12A:
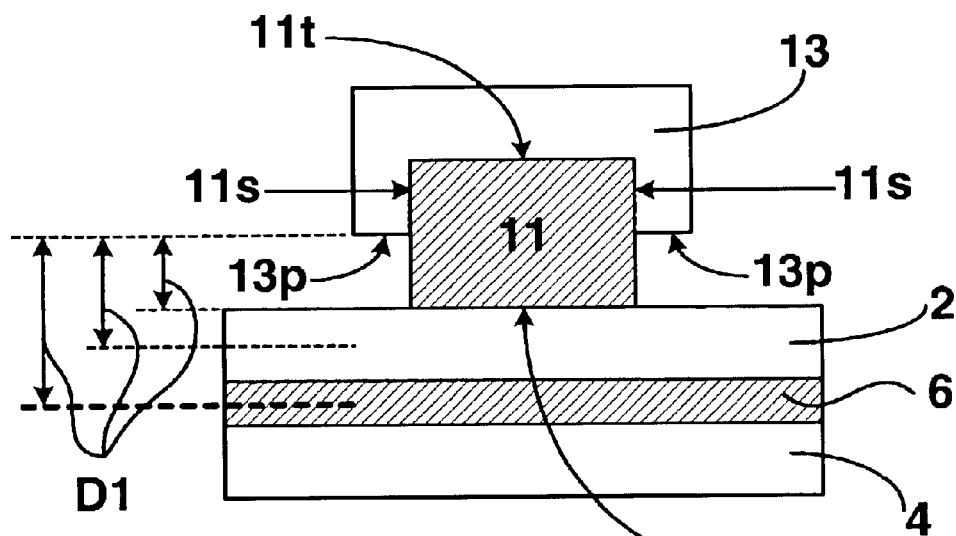
FIGS. 12a and 12b are cross-sectional views depicting first and second offset distances for recessed poles of a first and a second asymmetric cladding respectively relative to a predetermined point according to the present invention.

In FIG. 12a, the first offset distance D1 can be a distance that is measured between the first set of poles 13p and the bottom surface 11b of the first conductor 11 or a distance that is measured between the first set of poles 13p and a predetermined point on the memory cell 10. The predetermined point on the memory cell 10 can be the data layer 2. In FIG. 12a, the barrier layer 6 is also depicted as one possible choice for the predetermined point on the memory cell 10. Selection of the predetermined point on the memory cell 10 can be application dependent or it can be simply a matter of choice.

Because the data layer 2, the barrier layer 6, the reference layer 4, and any of the other layers that comprise the memory cell 10 are typically thin film layers that have a thickness of a few nanometers (nm) or less, the bottom surface 11b of the first conductor 11 is a logical choice for the predetermined point on the memory cell 10. On the other hand, because the effects of the asymmetric cladding (13, 17) are designed to have an effect on the data layer 2, the data layer 2 is also a logical choice for the predetermined point on the memory cell 10.

Figure 9A:
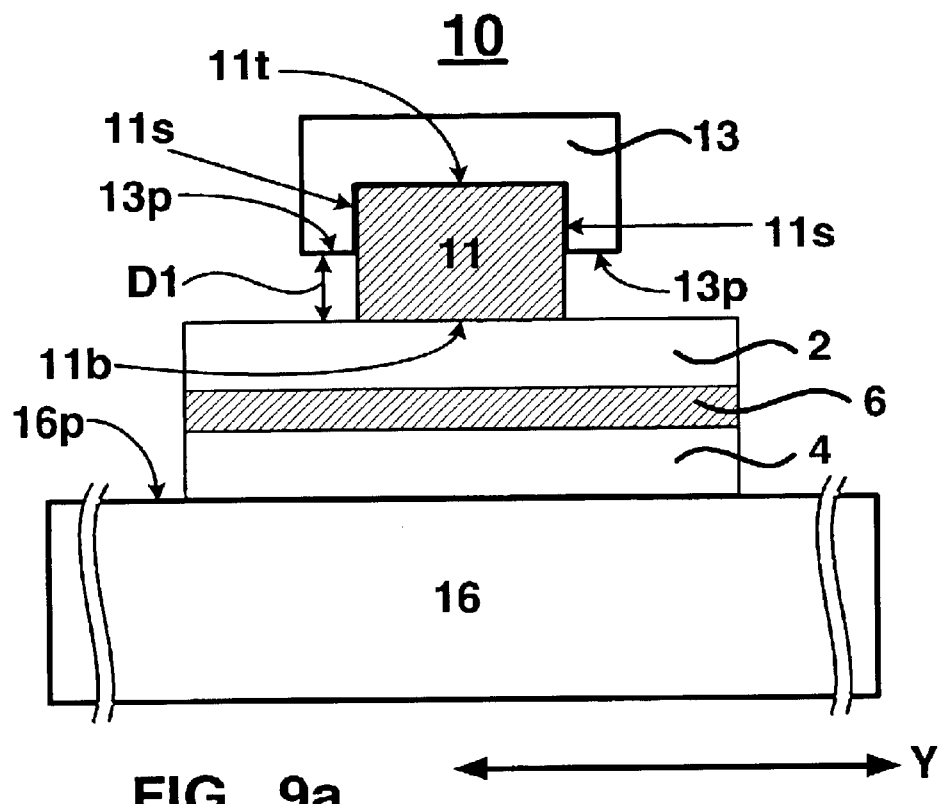
FIGS. 9a and 9b are cross-sectional views of the second conductor of FIGS. 8a and 8b with a second symmetric cladding connected therewith according to the present invention.
Figure 9B:
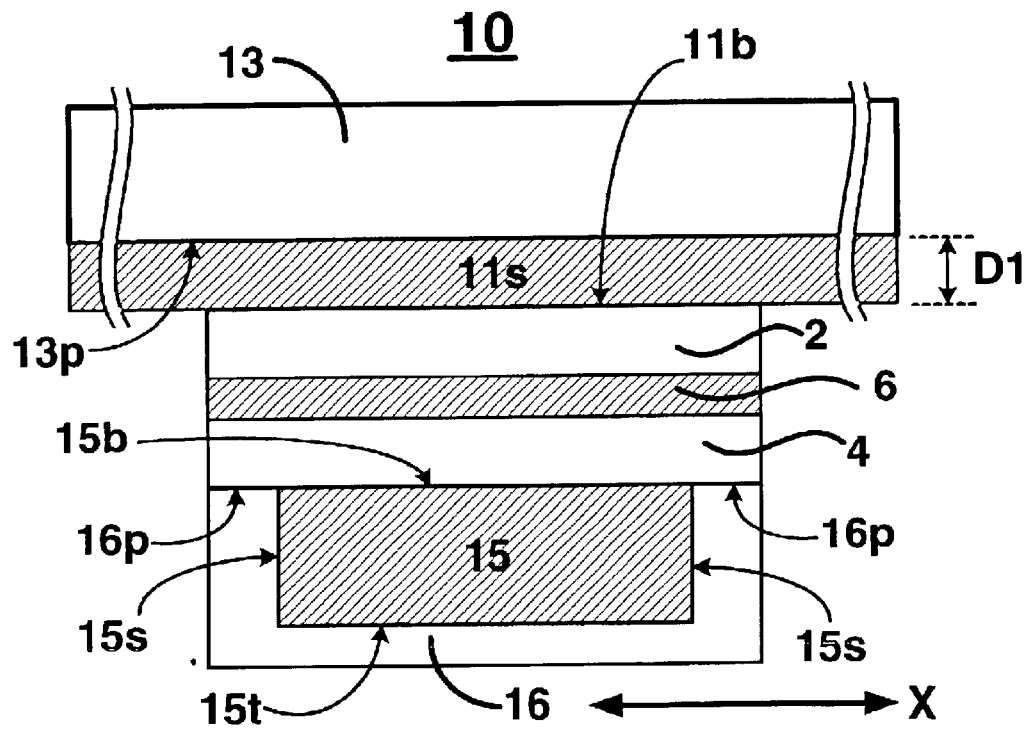

In one embodiment of the present invention, as illustrated in FIGS. 9a and 9b, the second conductor 15 includes a second symmetric cladding 16 that is connected with the top surface 15t and an entirety of the two side surfaces 15s (that is, the second symmetric cladding 16 is not recessed along the two side surfaces 15) and including a pair of poles 16p that are substantially flush with the bottom surface 15b. The second symmetric cladding 16 enhances a magnetic field generated by a current (not shown) flowing through the second conductor 15 and enhances coupling of that magnetic field with the data layer 2.

Figure 7A:
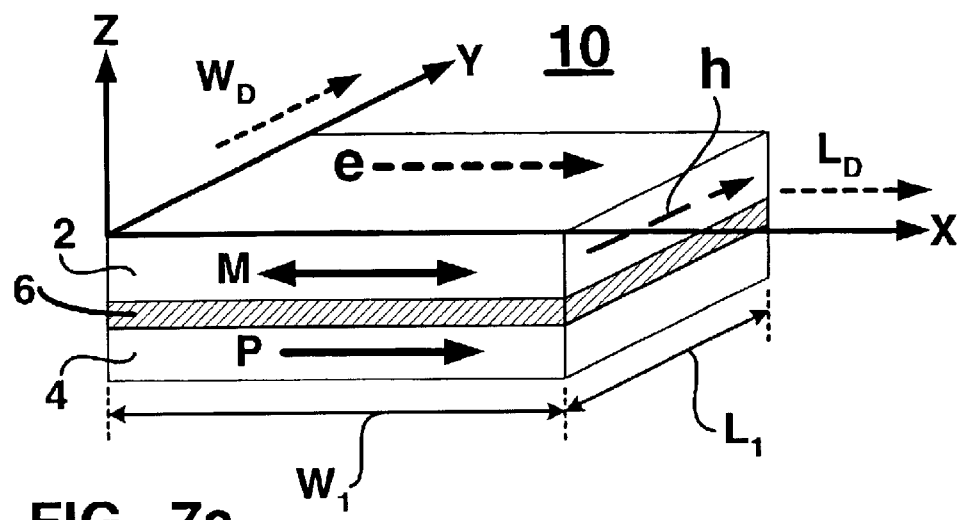
FIG. 7a is a profile view depicting a magnetic field sensitive memory cell according to the present invention.
Figure 7C:
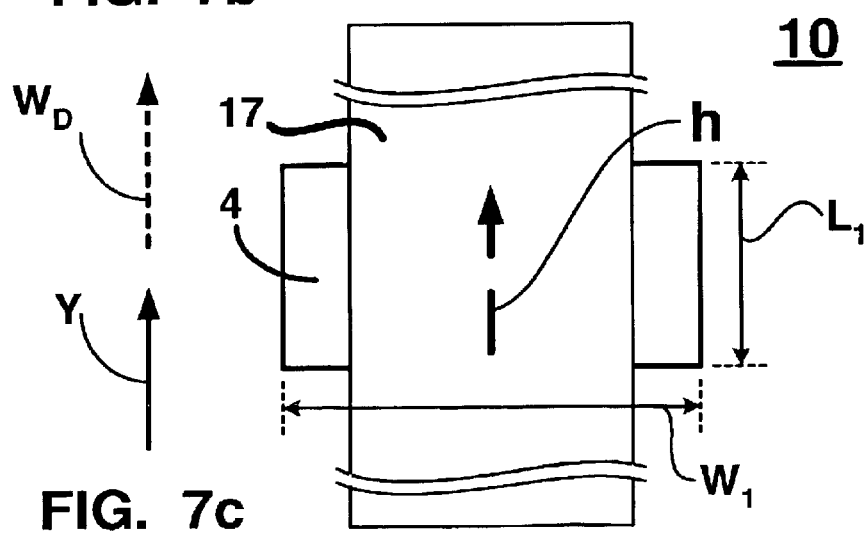
FIG. 7c is a bottom plan view of a second symmetric cladding of a second conductor that crosses a magnetic field sensitive memory cell according to the present invention.

In FIG. 7a, for purposes of illustration only, the memory cell 10 is shown in reference to a Cartesian coordinate system, wherein the length direction $L_D$ is aligned with a X-axis X (see also FIG. 7b) and the width direction $W_D$ is aligned with a Y-axis Y (see also FIG. 7c). The length direction $L_D$ is substantially orthogonal with a length $L_1$ of the memory cell and the width direction $W_D$ is substantially orthogonal with a width $W_1$ of the memory cell 10. A ratio of the width $W_1$ to the length $L_1$ defines an aspect ratio $A_R$ of the memory cell 10 (that is, $A_R = W_1 \div L_1$).

Moreover, in FIGS. 7a through 7c, an easy axis e of the data layer 2 is substantially aligned with the X-axis X and the hard axis h of the data layer 2 is substantially aligned with the Y-axis Y. Typically, the easy axis e and the alterable orientation of magnetization M are aligned with the longest side of the data layer 2 to take advantage of shape anisotropy which increases a magnetic stability of the data layer 2.

In prior memory cells, the magnetic stability benefits of shape anisotropy came at the expense of the data layer having an aspect ratio that was much greater than 1.0 so that the width dimension of the data layer was substantially larger than the length dimension. For example, in prior memory cells the aspect ratio can be from about 2.0 to about 3.0 or more. When the conductor that is orthogonal to the easy axis of the prior memory cell is cladded, the cladding increases the effective length of the data layer along the easy axis which further increases the magnetic stability of the data layer. However, that longer effective length makes switching of the data layer even harder and more current is required to effectuate switching of the data layer.

Figure 11:
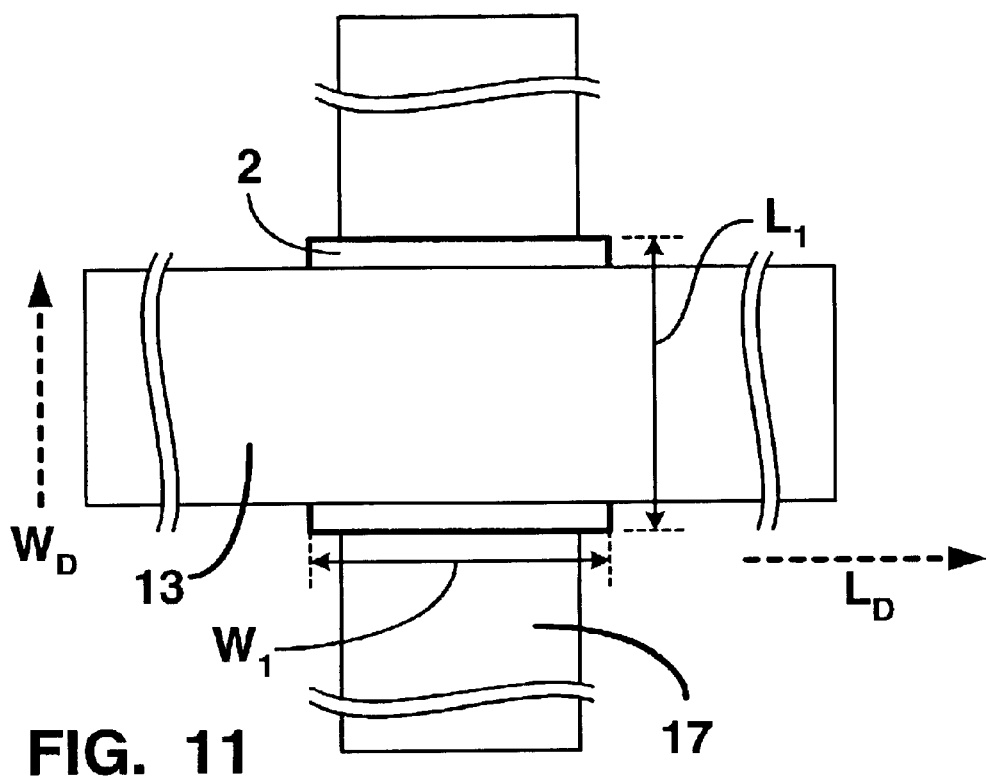
FIG. 11 is a top plan view depicting a magnetic field sensitive memory cell having a width and a length that are substantially equal to each other according to the present invention.

The first asymmetric cladding 13 on the first conductor 11 provides the necessary magnetic switching field enhancement that efficiently couples the available magnetic field generated by the current $I_x$ with the data layer 2 while also providing a controlled energy state in the data layer 2 that improves the switching characteristics of the data layer 2 and reduces unwanted magnetic interactions between the cladding 13 and the data layer 2. Consequently, the magnetic stability of the data layer 2 is increased and the width $W_1$ can be reduced with a corresponding reduction in the aspect ratio $A_R$ and an increase in areal density. The aspect ratio $A_R$ can be in a range from about 1.0 to about 1.6. Preferably, the aspect ratio $A_R$ is as close to 1.0 as possible so that the width $W_1$ and the length $L_1$ of the memory cell 10 are substantially equal to each other (i.e. $W_1 = L_1$) and the data layer 2 has a substantially square shape (see FIG. 11).

Figure 10A:
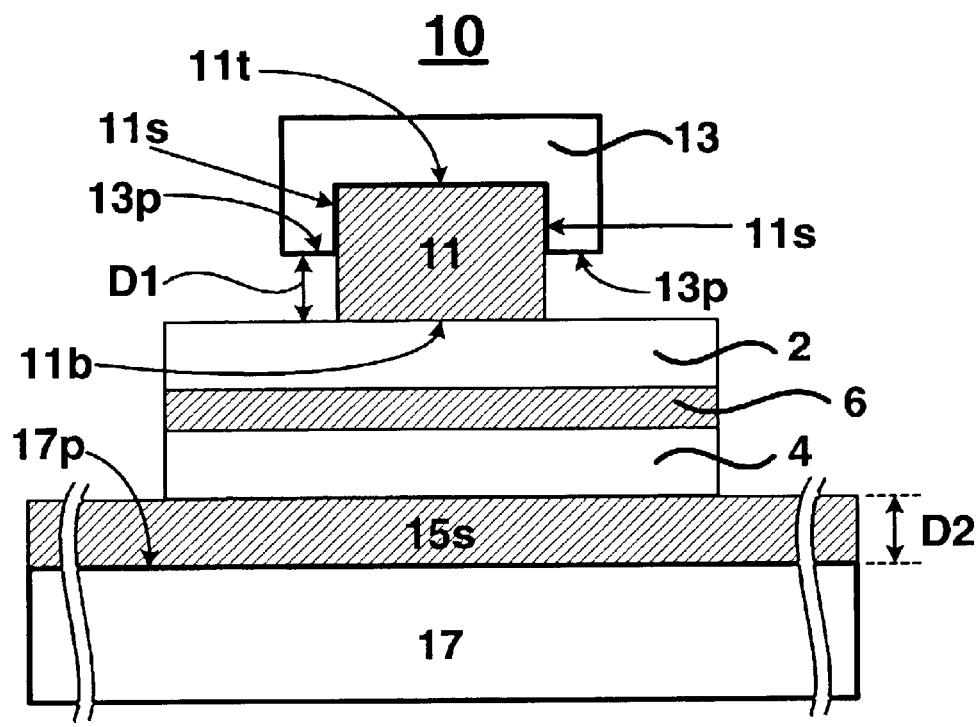
FIGS. 10a and 10b are cross-sectional views of first and second conductors including a first and a second asymmetric cladding respectively connected therewith according to the present invention.
Figure 10B:
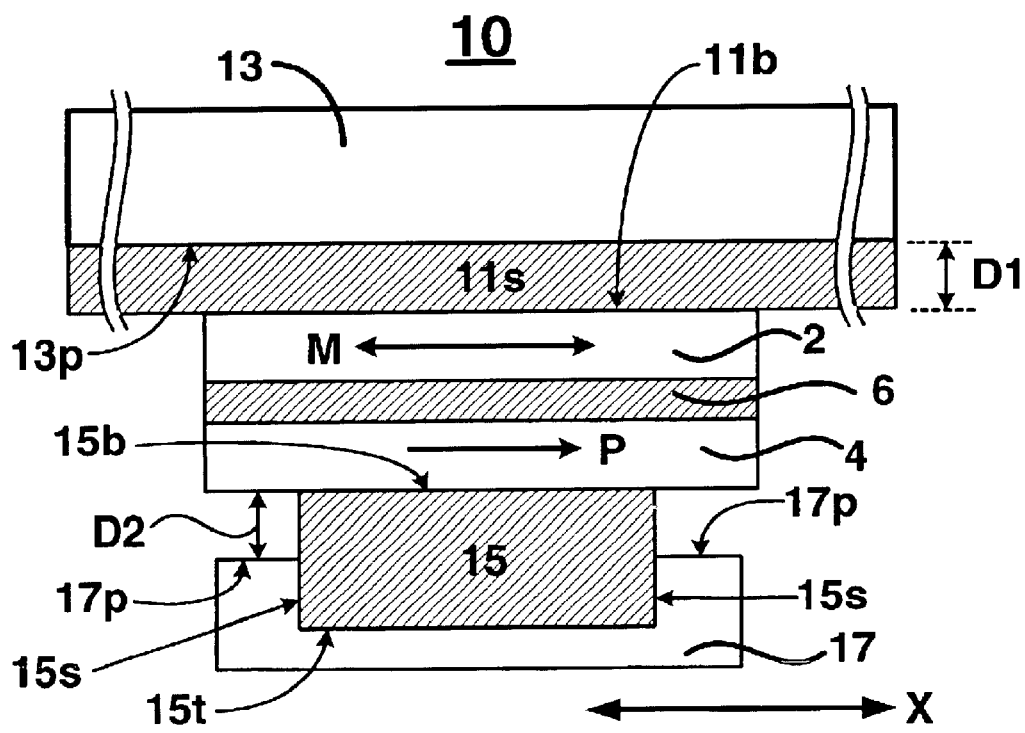

In another embodiment of the present invention, as illustrated in FIGS. 10a and 10b, the asymmetric cladding structure further includes a second asymmetric cladding 17 connected with the top surface 15t and only a portion of the two side surfaces 15s of the second conductor 15. That is, the second asymmetric cladding 17 does not cover an entirety of the two side surfaces 15s. The second asymmetric cladding 17 includes a second pair of poles 17p that are recessed along the two side surfaces 15s (i.e. in a direction that is away from the data layer 2) and are offset from the memory cell 10 by a second distance D2. The asymmetry in the second asymmetric cladding 17 is also due to the cladding covering only a portion of the opposed side surfaces 15s such that the second pair of poles 17p are not flush with the bottom surface 15b.

Figure 12B:
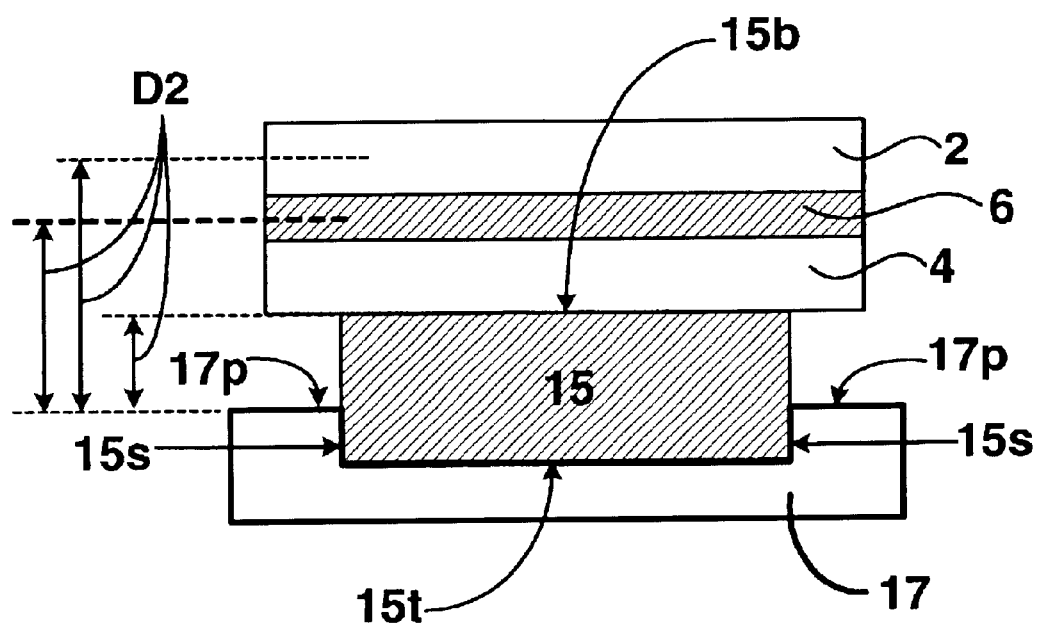

In FIG. 12b, the second offset distance D2 can be a distance that is measured between the second set of poles 17p and the bottom surface 15b of the second conductor 15 or a distance that is measured between the second set of poles 17p and a predetermined point on the memory cell 10. For example, the predetermined point on the memory cell 10 can be the data layer 2 or the barrier layer 6.

In FIG. 13, the first and second pairs of poles (13p, 17p) are asymmetrically spaced apart relative to the predetermined point on the data layer 2 such that a first distance T1 between the first pair of poles 13p and the predetermined point on the data layer 2 is not equal to a second distance T2 between the second pair of poles 17p and the predetermined point on the data layer 2 (i.e. T1≠T2). The asymmetric spacing can be due to differences in thicknesses of the various layers of materials that comprise the memory cell 10 and/or the first and second offset distances (D1, D2). Although T1 is depicted as being less than T2, T1 can also be greater than T2. The first offset distance D1 can be greater than the second offset distance D2 (i.e. D1>D2) or the second offset distance D2 can be greater than the first offset distance D1 (i.e. D2>D1). The switching characteristics of the data layer 2 can be tuned by adjusting the first and second offset distances (D1, D2) and/or the first and second distances (T1, T2). For example, the reluctance of the magnetic path through the data layer 2 is increased with an increase in (D1, D2) or (T1, T2).

In FIG. 16, a current $I_y$ flowing in the second conductor 15 generates a magnetic field $H_x$ that magnetically interacts with the data layer 2 through a closed magnetic path created by the second asymmetric cladding 17 (see dashed lines for $H_x$ that depict flux closure with the data layer 2). Because the second pair of poles 17p are recessed by the second distance D2, a reluctance $R_G$ of the closed magnetic path is higher at the second pair of poles 17p than a reluctance $R_c$ in the second asymmetric cladding 17 and a reluctance $R_D$ in the data layer 2. The second distance D2 interposes a gap that increases the total reluctance of the closed magnetic path for $H_x$. Resulting is a reduction in a magnetic coupling of the magnetic field $H_x$ with the data layer 2 and a reduction in a magnitude of a demagnetization field $H_{De}$ that is aligned along the easy axis e and is generated by magnetic charges (+, −) in the data layer 2 caused by the proximity of the second pair of poles 17p with the data layer 2.

In sharp contrast, to the large aspect ratios of the prior memory cells with cladded conductors, another advantage of the present invention is that the second asymmetric cladding 17 allows for a reduction in the width $W_1$ of the data layer 2 such that the aspect ratio $A_R$ can be reduced thereby increasing areal density. Other benefits from reducing the aspect ratio $A_R$ include improvements in the switching field characteristics of the data layer 2 and a reduction in the current required to switch the data layer 2.

Moreover, any reduction in the magnetic stability of the data layer 2 due to a reduction in shape anisotropy resulting from a reduction in the width $W_1$ are compensated for because the second asymmetric cladding 17 increases the effective length of the data layer 2 along the easy axis e. Therefore, the aspect ratio $A_R$ is reduced without totally eliminating the benefits of shape anisotropy in the data layer 2. The aspect ratio $A_R$ can be reduced to a range from about 1.0 to about 1.6. Preferably, the aspect ratio $A_R$ is as close to 1.0 as possible so that the width $W_1$ and the length $L_1$ of the memory cell 10 are substantially equal to each other (i.e. $W_1=L_1$) and the data layer 2 has a substantially square shape (see FIG. 11). The reduction in the aspect ratio $A_R$ is not limited to memory cells 10 that have a rectangular or square shape as illustrated herein. For instance, the memory cell 10 can have a shape including but not limited to an oval or ellipsoidal shape.

Figure 14A:
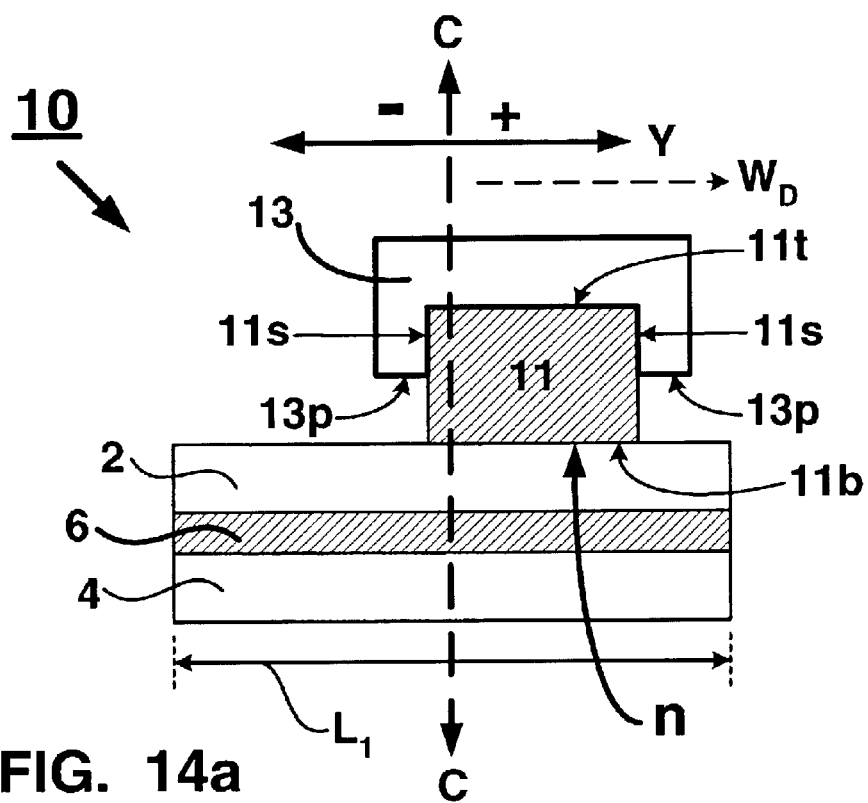
FIGS. 14a and 14b are cross-sectional views depicting laterally displaced first and second conductors respectively according to the present invention.
Figure 14B:
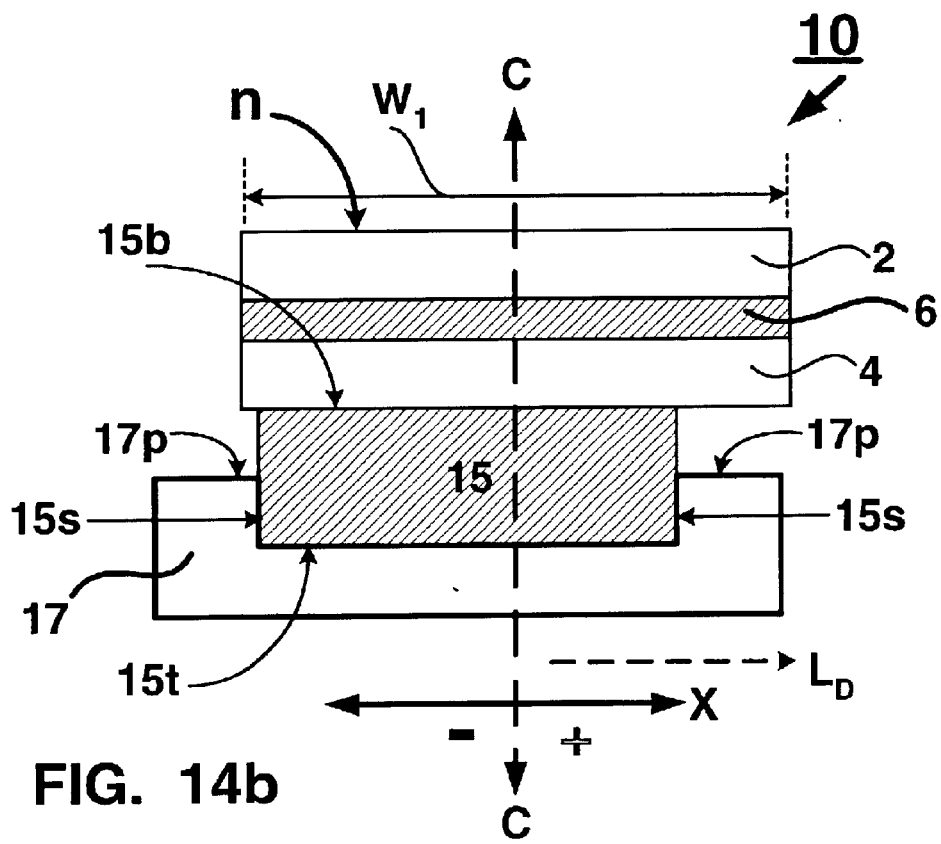

In FIGS. 14a and 14b, the switching characteristics of the data layer 2 can also be tuned by laterally displacing the first conductor 11 and/or the second conductor 15 so that the conductors (11, 15) are not symmetrically centered with the memory cell 10. For instance, in FIG. 14a, the first conductor 11 is laterally displaced (that is, shifted +, −from a center point C of the data layer 2) in a positive direction along the Y-axis Y so that the first conductor 11 is not symmetrically centered at the center point C. As a result, a point n in the data layer 2 in which nucleation of switching occurs is shifted away from the center point C thereby altering the switching characteristics of the data layer 2. Similarly, in FIG. 14b, the second conductor 15 is laterally displaced in a negative direction along the X-axis X so that the second conductor 15 is not symmetrically centered at the center point C the point n in the data layer 2 in which nucleation of switching occurs is shifted away from the center point C. The first conductor 11, the second conductor 15, or both the first and second conductors (11, 15) can be laterally displaced to achieve a desired change in the switching characteristics of the data layer 2.

Another advantage of the asymmetric cladded conductor structure of the present invention is that by asymmetrically cladding either one or both of the first and second conductors (11, 15), the half-select margin of an array 50 of memory cells 10 as illustrated in FIG. 18 is improved. The improvement in the half-select margin is obtained by the asymmetric cladding effectively increasing the aspect ratio $A_R$ because an effective length of the data layer 2 is increased by the asymmetric cladding.

For instance, if the physical dimensions of the data layer 2 are such that $W_1 \cong L_1$ and the aspect ratio $A_R$ of the data layer 2 is about 1.0, then the asymmetric cladding 17 of the second conductor 15 can increase an effective width of the data layer 2 so that $W_1$ is slightly increased and $W_1 \div L_1$ is greater than 1.0. As an example, if the physical dimensions of $W_1$ and $L_1$ are 1.0 μm and the asymmetric cladding 17 has the effect of increasing $W_1$ to 1.3 μm, then the physical aspect ratio $A_R$ of the data layer 2 is 1.0 (i.e. 1.0 μm÷1.0 μm); however, the effective aspect ratio $A_R$ is 1.3 (i.e. 1.3 μm÷1.0 μm) and that effective increase in the aspect ratio $A_R$ improves the half-select margin among the memory cells 10 in the array 50.

Figure 17A:
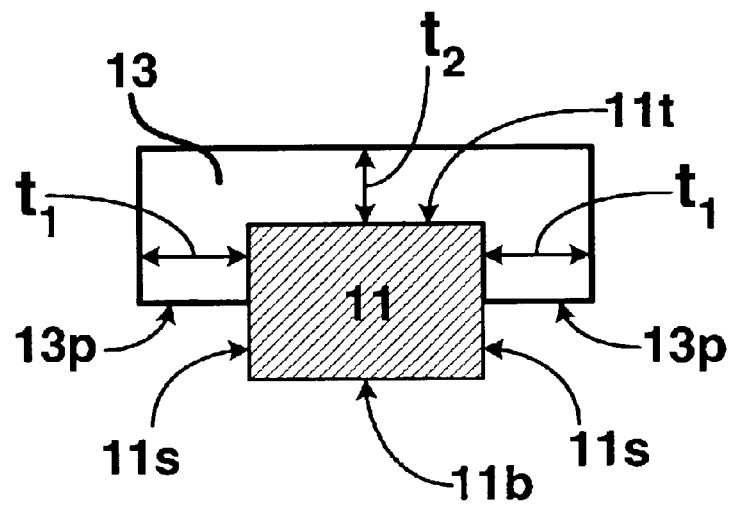
FIGS. 17a and 17b are schematic views illustrating variations in asymmetric cladding thickness according to the present invention.
Figure 17B:
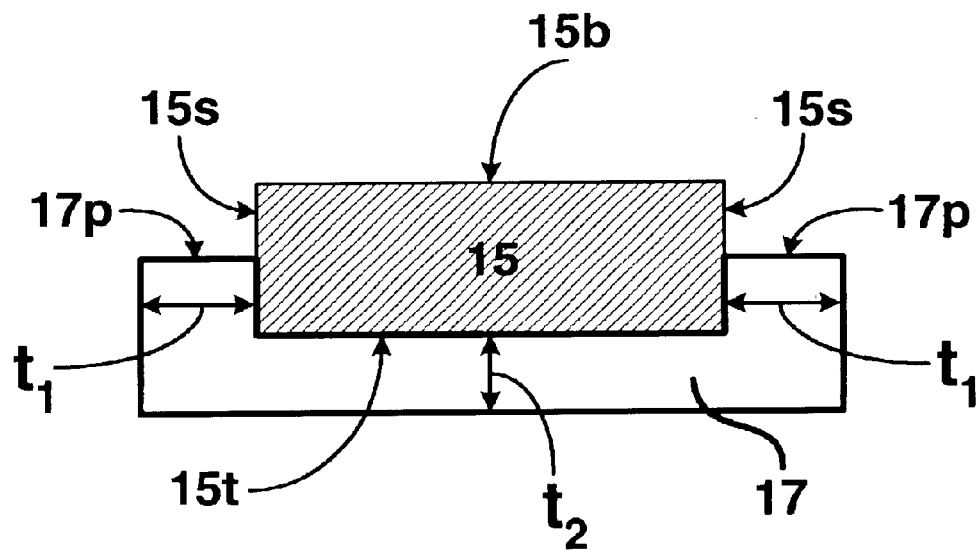

In FIGS. 17a and 17b, an example of the first and second asymmetric claddings (13, 17) respectively includes a first thickness $t_1$ along the two side surfaces (11s, 15s) and a second thickness $t_2$ along the top surfaces (11t, 15t) and the first thickness $t_1$ is different than then the second thickness $t_2$ (i.e. $t_1 \neq t_2$). Different thicknesses for $t_1$ and $t_2$ may occur as an artifact of a fabrication process used in forming the asymmetric claddings (13, 17) or may be introduced intentionally to counteract differences in magnetic properties between films grown on the side surfaces (11s, 15s) and films grown on the top surfaces (11t, 15t). For example, the first thickness $t_1$ can be greater than the second thickness $t_2$ (i.e. $t_1 > t_2$). As another example, $t_1$ can be from about 1.2 times thicker than $t_2$ to about 2.0 times thicker than $t_2$.

Suitable electrically conductive materials for the first and second conductors (11, 15) include but are not limited to copper (Cu), aluminum (Al), aluminum copper (AlCu), tantalum (Ta), gold (Au), silver (Ag), and alloys of those materials. Suitable ferromagnetic materials for the first and second asymmetric cladding (13, 17) include but are not limited to nickel iron (NiFe), nickel iron cobalt (NiFeCo), cobalt iron (CoFe), PERMALLOY™, and alloys of those materials.

Depending on the process used for forming the first and second asymmetric claddings (13, 17), the first distance D1 for the first pair of poles 13p and the second distance D2 for the second pair of poles 17p may not be exactly equal. That is, D2 on one side of the second conductor 15 may not be exactly equal to D2 on the other side of the second conductor 15. For example, the first distance D1 on one side surface 11s of the first conductor 11 may not be exactly equal to the first distance D1 on the other side surface 11s such that one pole 13p is either closer to or further away from the predetermined point on the memory cell 10 than is the other pole 13p. Those differences can be due to slight differences in deposition or sputtering rates in the process used to from the asymmetric claddings (13, 17), for example.

Although several embodiments of the present invention have been disclosed and illustrated, the invention is not limited to the specific forms or arrangements of parts so described and illustrated. The invention is only limited by the claims.

What is claimed is:

1. An asymmetric cladding structure for a magnetic memory device including a magnetic field sensitive memory cell, comprising:
    a first conductor crossing the memory cell in a length direction and including a top surface, two side surfaces, and a bottom surface positioned in facing relation with the memory cell;
    a first asymmetric cladding connected with the top surface and only a portion of the two side surfaces and including a first pair of poles recessed along the two side surfaces and offset from the memory cell by a first distance; and
    a second conductor crossing the memory cell in a width direction and including a top surface, two side surfaces, and a bottom surface positioned in facing relation with the memory cell.

2. The asymmetric cladding structure of claim 1, wherein the length direction is substantially orthogonal with a length of the memory cell and the width direction is substantially orthogonal with a width of the memory cell and a ratio of the width to the length defines an aspect ratio.

3. The asymmetric cladding structure of claim 2, wherein the aspect ratio is in a range from about 1.0 to about 1.6.

4. The asymmetric cladding structure of claim 1, wherein the first offset distance is a distance selected from the group consisting of a distance between the first pair of poles and the bottom surface of the first conductor and a distance between the first pair of poles and a predetermined point on the memory cell.

5. The asymmetric cladding structure of claim 4, wherein the predetermined point on the memory cell comprises a data layer of the memory cell.

6. The asymmetric cladding structure of claim 1, wherein the length direction is substantially aligned with an easy axis of the memory cell and the width direction is substantially aligned with a hard axis of the memory cell.

7. The asymmetric cladding structure of claim 1, wherein the second conductor further comprises a second symmetric cladding connected with the top surface and an entirety of the two side surfaces and including a pair of poles that are substantially flush with the bottom surface.

8. The asymmetric cladding structure of claim 1, wherein the first conductor is laterally displaced so that the first conductor is not symmetrically centered with the memory cell.

9. The asymmetric cladding structure of claim 1, wherein the first asymmetric cladding further includes a first thickness along the two side surfaces and a second thickness along the top surface and the first thickness has a thickness selected from the group consisting of not equal to the second thickness and greater than the second thickness.

10. The asymmetric cladding structure of claim 9, wherein the first thickness is in a range from about 1.2 times the second thickness to about 2.0 times the second thickness.

11. The asymmetric cladding structure of claim 1 and further comprising a second asymmetric cladding connected with the top surface and only a portion of the two side surfaces of the second conductor and including a second pair of poles recessed along the two side surfaces of the second conductor and offset from the memory cell by a second distance.

12. The asymmetric cladding structure of claim 11, wherein the second offset distance is a distance selected from the group consisting of a distance between the second pair of poles and the bottom surface of the second conductor and a distance between the second pair of poles and a predetermined point on the memory call.

13. The asymmetric cladding structure of claim 12, wherein the predetermined point on the memory cell comprises a data layer of the memory cell.

14. The asymmetric cladding structure of claim 13, wherein the first pair of poles and the second pair of poles are asymmetrically spaced apart relative to the predetermined point on the data layer.

15. The asymmetric cladding structure of claim 11, wherein the second offset distance is greater than the first offset distance.

16. The asymmetric cladding structure of claim 11, wherein the first offset distance is greater than the second offset distance.

17. The asymmetric cladding structure of claim 11, wherein the length direction is substantially orthogonal with a length of the memory cell and the width direction is substantially orthogonal with a width of the memory cell and a ratio of the width to the length defines an aspect ratio.

18. The asymmetric cladding structure of claim 17, wherein the aspect ratio is in a range from about 1.0 to about 1.6.

19. The asymmetric cladding structure of claim 11, wherein the first conductor is laterally displaced so that the first conductor is not symmetrically centered with the memory cell.

20. The asymmetric cladding structure of claim 11, wherein the second conductor is laterally displaced so that the second conductor is not symmetrically centered with the memory cell.

21. The asymmetric cladding structure of claim 11, wherein the first conductor is laterally displaced so that the first conductor is not symmetrically centered with the memory cell and wherein the second conductor is laterally displaced so that the second conductor is not symmetrically centered with the memory cell.

22. The asymmetric cladding structure of claim 11, wherein the length direction is substantially aligned with an easy axis of the memory cell and the width direction is substantially aligned with a hard axis of the memory cell.

23. The asymmetric cladding structure of claim 11, wherein a selected one or both of the first asymmetric cladding and the second asymmetric cladding further includes a first thickness along the two side surfaces and a second thickness along the top surface and the first thickness has a thickness selected from the group consisting of not equal to the second thickness and greater than the second thickness.

24. The asymmetric cladding structure of claim 23, wherein the first thickness is in a range from about 1.2 times the second thickness to about 2.0 times the second thickness.

* * * * *